(12) United States Patent
Vacca et al.

(10) Patent No.: US 8,383,006 B2
(45) Date of Patent: Feb. 26, 2013

(54) COMPOSITION FOR THE PROTECTION OF MOISTURE SENSITIVE DEVICES

(75) Inventors: Paolo Vacca, Rome (IT); Antonio Bonucci, Milan (IT); Sergio Rondena, Magenta (IT); Roberto Macchi, Solbiate Olona (IT)

(73) Assignee: SAES Getters S.p.A., Lainate (MI) (IT)

( * ) Notice: Subject to any disclaimer, the term of this patent is extended or adjusted under 35 U.S.C. 154(b) by 0 days.

(21) Appl. No.: 13/144,491

(22) PCT Filed: Mar. 14, 2011

(86) PCT No.: PCT/EP2011/053759
§ 371 (c)(1),
(2), (4) Date: Jul. 13, 2011

(87) PCT Pub. No.: WO2011/117094
PCT Pub. Date: Sep. 29, 2011

(65) Prior Publication Data
US 2011/0315923 A1 Dec. 29, 2011

(30) Foreign Application Priority Data

Mar. 22, 2010 (IT) .......................... MI2010U0080 U
Sep. 8, 2010 (KR) ....................... 10-2010-0087877

(51) Int. Cl.
*B01J 20/04* (2006.01)
*B01J 20/16* (2006.01)
*B01J 20/18* (2006.01)
*C09K 3/00* (2006.01)

(52) U.S. Cl. ....... 252/194; 252/181.4; 502/84; 502/402; 502/405; 502/411; 502/427; 428/405; 428/296.7; 428/319.1; 428/319.3; 428/330; 96/153

(58) Field of Classification Search ............... 252/194, 252/181.4; 502/84, 402, 405, 411, 427; 428/405, 428/296.7, 319.1, 319.3, 330; 96/153
See application file for complete search history.

(56) References Cited

U.S. PATENT DOCUMENTS

| | | | | |
|---|---|---|---|---|
| 4,081,397 | A | * | 3/1978 | Booe .............................. 252/194 |
| 5,304,419 | A | * | 4/1994 | Shores ....................... 428/355 R |
| 7,300,500 | B2 | * | 11/2007 | Okada et al. .................... 96/153 |
| 7,744,669 | B2 | * | 6/2010 | Paisley et al. ................... 55/523 |
| 2005/0241483 | A1 | * | 11/2005 | Okada et al. ..................... 96/134 |
| 2006/0032866 | A1 | * | 2/2006 | Labbe et al. .................. 222/107 |

(Continued)

FOREIGN PATENT DOCUMENTS

| | | |
|---|---|---|
| JP | 2006066366 | 3/2006 |
| JP | 2006088138 | 4/2006 |

(Continued)

OTHER PUBLICATIONS

PCT International Search Report for PCT/EP2011/053759 filed on Mar. 14, 2011 in the name of Saes Getters S.P.A.

(Continued)

*Primary Examiner* — Joseph D Anthony
(74) *Attorney, Agent, or Firm* — Steinfl & Bruno, LLP

(57) ABSTRACT

Improved polisiloxane composite barrier to control, preventing the ingress, limiting the level of $H_2O$ within devices sensitive to its presence, method for its production, sensitive devices employing such barriers for the control of the $H_2O$ level within.

16 Claims, 1 Drawing Sheet

U.S. PATENT DOCUMENTS

| | | | |
|---|---|---|---|
| 2009/0236717 A1* | 9/2009 | Hild | 257/682 |
| 2009/0289549 A1* | 11/2009 | Lee et al. | 313/553 |
| 2011/0132449 A1* | 6/2011 | Ramadas et al. | 136/256 |

FOREIGN PATENT DOCUMENTS

| | | |
|---|---|---|
| WO | 2008/057045 | 5/2008 |
| WO | 2009/126115 | 10/2009 |

OTHER PUBLICATIONS

PCT Written Opinion for PCT/EP2011/053759 filed on Mar. 14, 2011 in the name of Saes Getters S.P.A.

* cited by examiner

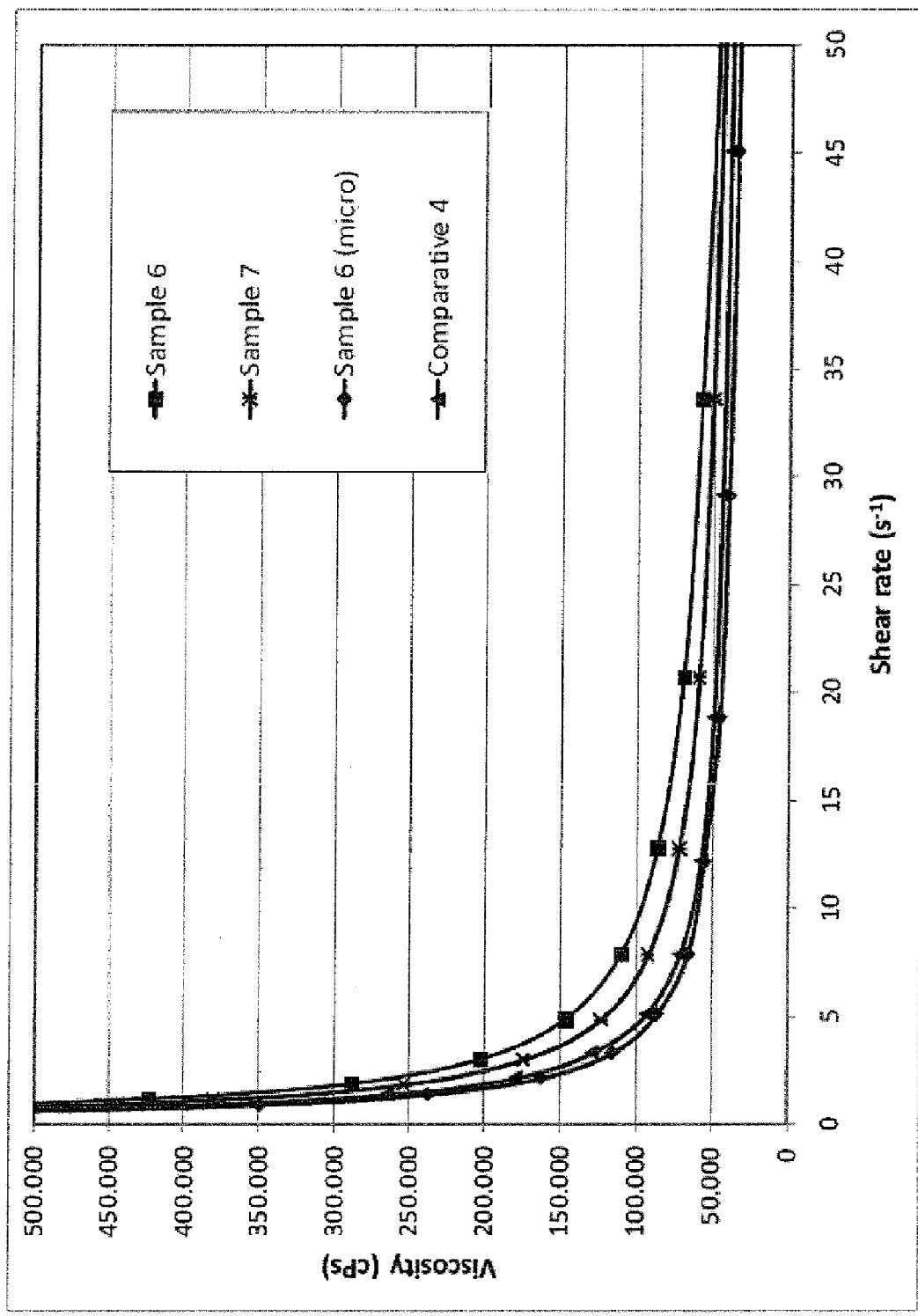

COMPOSITION FOR THE PROTECTION OF MOISTURE SENSITIVE DEVICES

CROSS REFERENCE TO RELATED APPLICATIONS

The present application is the US national stage of International Application PCT/EP2011/053759 filed on Mar. 14, 2011 which, in turn, claims priority to Italian Application MI2010U000080, filed on Mar. 22, 2010 and South Korean Application 10-2010-0087877 filed on Sep. 8, 2010.

The present invention in a first aspect relates to an improved composite material to control the level of $H_2O$, by preventing moisture from entering devices sensitive to its presence, to a mixture for the production of this composite material and to sensitive devices that employ such material to control the level of $H_2O$ at their inside.

Such a composite material can be employed as perimetral barrier and positioned adjacent to the device perimeter or as a filler (i.e. material able to fill the enclosed free volume in the sealed device). The composite materials according to the present invention are used to improve or solve the interface and encapsulation problems of sensitive devices, forbidding $H_2O$ to reach the inner portion of the device thus degrading its characteristics.

These composite materials, sometimes herein referred also with the term composite barriers in view of their functional properties, comprise a polysiloxane matrix in which $H_2O$ sorbers are dispersed.

The use of polysiloxane barriers is very advantageous, since it is possible to obtain these barriers from a suitable mix of precursors that allow the modulation of the rheological properties in order to adapt the same to the different processes used for their deposition, such as jetting, spin coating or screen printing. The characteristics of the starting mixture allow also for the optimization of the mechanical features of the composite material exploiting the different degree of applicable cross-linking.

U.S. Pat. No. 4,081,397 discloses a composition of matter that had been provided of alkaline earth oxides in elastomeric matrix to be used in electronic and electrical devices. That composition is directed to be used only as getter (i.e. desiccant) material to be inserted as discrete element able to absorb moisture after its permeation inside a sealed device, but is not useful to be used as a barrier material. Moreover, a limitation in the use of that composition is caused by the possible and unpredictable change in viscosity with respect to the polymeric resin when inorganic powders are provided.

Particularly, for what pertains to the use of the compositions according to the present invention there are two main modalities. In the first one the cross-linking (or curing) process gives higher molecular weight polymers: in this case the resulting matrix will exhibit viscoelastic properties, i.e. at room temperature this material will be beyond its vitrification temperature, while a high cross-linking degree will give a higher rigidity to the system. This solution is preferred in case of a perimetral sealing, since this will contribute to the structural integrity of the device.

In an alternative embodiment the curing processes lead to a lesser cross-linking degree. In this case composite barriers with the characteristics of a gel are obtained, thus capable of adapting to mechanical stresses, but at the same time having the dimensional stability of an elastomeric material. In view of this property this second category of materials is preferably used as filling solution of the inner volume of a sensitive device and are advantageously used in flexible devices.

The $H_2O$ sorbers dispersed within the polysiloxane matrix according to the present invention are constituted by at least two different types of sorbers: an irreversible sorber preferably chosen from the alkaline-earth metal oxides, and a reversible sorber chosen from aluminosilicates, with particular reference to molecular sieves or zeolites, silica gel, clay.

The concept of reversible and irreversible moisture sorber is to be interpreted with respect to the process temperature for the production of the sensitive devices, or polymeric matrix cross-linking, whereby with irreversible sorber it is intended a sorber that does not re-activate (releasing significant amount of moisture, i.e. more than 20% wt with respect the amount of the sorber) at low temperatures, typically not higher than 150° C., such as the alkaline earth metal oxides, with particular reference to the Calcium Oxide; whereas with reversible sorber it is intended a sorber that regenerates at those temperatures, releasing the majority of trapped moisture. More specifically, the reversible sorbers suitable to be used in the present invention are characterized by releasing at least fifty percent with respect to their maximum moisture sorption capacity when subjected to a thermal treatment with temperature comprised between 70 and 180° C.

Object of the present invention it is a particularly useful and specific combination between the weight ratios of such reversible and irreversible sorbers with respect the overall weight of the barrier, sorbers that shall also possess some particular dimensional limitations.

It has been found that with such a specific combination two distinct technical effects are achieved: particularly there is no negative impact or alteration of the rheologial properties, both for the final barrier (relevant for the characteristics of the final product) and also for the starting mixture (relevant aspect during the production phase of the sensitive device), and at the same time a sufficient capacity for moisture removal is guaranteed. Moreover this combination enhances the sorbers dispersion stability in the barrier precursor, the starting mixture. Rheological properties, in fact, are usually strongly related to the inorganic content in the polymeric material. It is usually expected by the experts in the field that the rheology of the polymeric material worsen when the content of inorganic sorbing particles increases.

A second technical effect achieved with the preferred compositions according to the present invention is the improvement of a parameter of paramount importance for the sensitive device lifetime, i.e. the breakthrough time, defined as the time required by $H_2O$ to penetrate within the sensitive device from its outside.

In view of the above, in a first aspect thereof, the invention consists in the use of a polysiloxane matrix as a barrier to the ingress of $H_2O$ within sensitive devices containing at least two types of sorbers, characterized in that said polysiloxane matrix contains between 10 and 55% wt of an irreversible $H_2O$ sorber consisting essentially of powders of one or more alkaline earth metal oxides chosen from oxides of calcium, strontium, barium, magnesium, and between 1 and 5% wt of a $H_2O$ reversible sorber consisting essentially of powders of one or more aluminosilicates, wherein the size of 95% of the powders of said sorbers is not higher than 10 μm.

With the term 'consisting essentially' it is envisioned the possibility that for both the irreversible and the reversible sorbers there could be present also other elements, in a quantity not higher than 10% wt with respect to the reference sorber type.

Weight percentages are expressed against the total weight of the composition, consisting in the polysiloxane and all the inorganic sorbers contained therein.

In a preferred embodiment the reversible sorber amount with respect to the total amount of the sorber powders (i.e. the total weight of reversible and irreversible sorbers) is more than the 2% but less than 20%, more preferably between 2.5% and 7%.

In the preferred embodiment the weight ratio between the irreversible sorber and the reversible sorber is comprised between 2 and 45, more preferably between 13 and 20.

In a preferred embodiment the alkaline earth metal oxide is calcium oxide.

The selection of the powders granulometry of the alkaline earth metal oxide is obtained by sieving, resulting in a distribution of the powders dimension that has a maximum given by the dimensions of openings of the sieved employed (5 μm) or employing milling processes leading to a sufficient degree of fragmentation. In this case it is possible, for a small fraction of the powders (less than 5%), to have greater dimensions with respect to the above specified limit.

Preferably the granulometry is not higher than 5 μm; therefore a 5 μm sieve is usually used.

With regard to the reversible sorbers, they can also be employed in nanometric form. In this latter case it is not possible or convenient to rely on sieving or milling processes for the granulometry selection, but it is convenient to carry out the selection by means of the synthesis processes of the reversible sorber, in this case achieving distributions peaked around the selected value.

The irreversible sorber shall be employed in its anhydrous form, whereby suitable solutions, known in the technical field, shall be used in order to avoid its hydration at high levels and consequent capacity loss. This is not mandatory for handling the reversible sorber, especially when a thermal process is used for the polysiloxanic matrix cross-linking, since in this case the curing process causes also the re-activation of the reversible sorber.

In a preferred embodiment the reversible sorber consists in Na-LTA (4A) zeolites.

It has been observed a surprising technical effect when the reversible sorber is used at nanometric dimensions, meaning with the particles size being comprised between 50 and 500 nm, and when the concentration of the reversible sorber is comprised between 1 and 5% wt. This further effect will be further illustrated by means of the following examples.

The composition according to the present invention may also be advantageously used with other elements, such as peripheral sealants for sensitive devices. In a preferred configuration the composite barrier according to the present invention is adjacent to the sealant, facing the inner part of the sensitive device. In an alternative embodiment the composite barrier according to the present invention is used as a filler of the internal volume of sensitive devices, closed by means of a sealant. Also the composition according to the present invention may be used with other elements acting as interface between the internal surfaces of the sensitive device, that is in more complex configurations with respect to the one used in example 1, known in the field as glass to glass configuration.

In a second aspect thereof the invention refers to mixtures containing siliconic precursors obtained mixing at least two different components:
 1) between 40 and 70% wt of di-dimethyl siloxane with dimethylvinyl terminations; and
 2) between 5 and 40% wt of di-methylvinyl or tri-methylvinyl silica,
and containing between 10 and 55% wt of an irreversible moisture sorber consisting essentially by powders of one or more alkaline earth metal oxides chosen from oxides of calcium, strontium, barium, magnesium, and by 1 and 5% wt of a $H_2O$ reversible sorber consisting essentially of powders of one or more aluminosilicates in which the size of 95% of the powders is not higher than 10 μm.

In an alternative embodiment, the siliconic precursor mixtures further contain di-dimethyl hydroxy siloxane up to the 40% wt.

In a third aspect thereof the invention consists in a device sensitive to the presence of $H_2O$ and comprising a composite material for the control of the quantity of $H_2O$ according to the description previously given. Most advantageously such devices employ the barrier with the reversible sorber in nanometric form.

Among the most interesting sensitive devices that can obtain benefit from the present technical solution there are the electronic devices, Micro ElectroMechanical or Micro Opto-Electronic devices (respectively know in the field as MEMs and MOEMs devices) and organic electroluminescent devices, with particular reference to Organic Light Emitting Diode (OLED) and Organic Light Emitting Transistor (OLET) devices.

EXAMPLE 1

Samples Preparation and Characteristics

Different samples are prepared mixing together Calcium Oxide (irreversible sorber) and zeolites Na-LTA 4A (reversible sorber) peaked at 100 nm, so with a particle size between 50 and 150 nm in a polisiloxane matrix. Sample 1 and Sample 2 compositions are according to the present invention and compared to different samples (Comparative 1-3).

The amount loaded into the matrix have been chosen in order to have the same nominal capacity for moisture, to establish that any effect observed is not related to the different sorption capacity.

Table 1 shows the characteristics of the samples

TABLE 1

| Sample ID | H2O Capacity | CaO % wt | Zeolite % wt |
|---|---|---|---|
| Comparative 1 | 6.43 | 20 | 0 |
| Comparative 2 | 6.43 | 19.66 | 0.67 |
| Sample 1 | 6.43 | 18.18 | 3.63 |
| Comparative 3 | 6.43 | 16.48 | 7.06 |
| Sample 2 | 6.43 | 18.18 | 3.63 |

In all the previous samples the average size of the CaO powders is 1.64 μm, the size of the reversible sorber for samples Comparative 1-3 and Sample 1 was nanometric, while in Sample 2 the size of the zeolite Na-LTA (4A) powders were centered around 10 μm.

The previous samples have been tested using them as filler in two glasses frames 24×60 mm, spaced apart by 100 μm.

The composition is dispensed as precursor of the final matrix and consolidated by means of thermal curing (150° C. for 1 hour).

The frames are then subjected to an accelerated damp test, exposing them to an atmosphere containing 85% RH at 85° C. and the moisture penetration within the frames is detected after 64 hours by means of a visual optical measurement by observation its discoloration in correspondence of the penetration front. These measurements were also confirmed by means of a more precise FTIR mapping.

The length of the penetration front is a parameter that is correlated with the breakthrough time.

The results obtained with the compositions of table 1 are reported in Table 2.

TABLE 2

| Sample ID | Moisture Penetration Length (mm) 85% RH, 85° C. 64 hours |
|---|---|
| Comparative 1 | 6.2 |
| Comparative 2 | 6.03 |
| Sample 1 | 5.6 |
| Comparative 3 | 6.19 |
| Sample 2 | 6.38 |

From the previous table it is possible to observe that there is a heightened effect operating in the preferred conditions for the zeolites.

In particular, looking at the results obtained for samples Comparative 1, Comparative 2 and Sample 1, it is possible to observe a significant decrease in the penetration length with Sample 1, such decrease leading to a significant prolongation of the lifetime of a sensitive device, once operated in a standard environment (these results are inherent to an accelerated damp test).

Similar and even more surprising considerations apply also comparing the results for Sample 1 with the ones for Comparative 3, since in this case at a constant capacity, an increased amount of the reversible sorber corresponds to an increase in the moisture penetration front.

The comparison between Sample 1 and Sample 2 allows to observe the impact on the size of the reversible absorber, since both samples have nominally the same compositions, but Sample 2 exhibit a much higher penetration length.

The above experiments shows that there is an improvement operating with a moisture reversible sorber mixed with the irreversible moisture sorber when the loading of the moisture sorber is comprised between 1 and 5% wt. An improvement is achieved using the sorbers with powders in the micron range, but it is maximized when the reversible sorber has nanometric powders size.

EXAMPLE 2

Different compositions according to the present invention and shown in Table 3 have been dispensed on stainless steel sheets and spread by using an automatic blade.

TABLE 3

| Sample ID | Zeolites w/w % | CaO w/w % | zeo/ (zeo + CaO) % | ratio (CaO/zeo) | Sorption Rate mg cm$^{-2}$ min$^{-1}$ |
|---|---|---|---|---|---|
| Sample 3 | 2.00 | 30.00 | 6.25 | 15.00 | 8.00E−04 |
| Sample 4 | 2.20 | 33.00 | 6.25 | 15.00 | 1.36E−03 |
| Sample 5 | 2.67 | 40.00 | 6.25 | 15.01 | 1.96E−03 |
| Sample 6 | 3.33 | 50.00 | 6.24 | 15.02 | 2.16E−03 |
| Sample 7 | 1.23 | 51.05 | 2.35 | 41.50 | 8.40E−04 |

All the Samples have been obtained using zeolites Na-LTA (4A) peaked at 300 nm and Calcium Oxide as sorber powders.

The final layers were 5*10 cm in size and 50 micron in thickness. The layers have been thermally cured at 150° C. for 1 hour in order to promote the siloxane matrix polymerization and then submitted to a gravimetric test in a climatic cell at 22° C. and 55% RH conditions.

The gravimetric characterization has been performed by monitoring the sample weight in function of the exposure to the humidity and used to calculate the moisture sorption rate. Such rate is a parameter that is directly measurable and correlated with the breakthrough time. Because of its ease and low cost this gravimetric test can be better integrated in manufacturing lines as quality test on the final product if compared with FTIR mapping test (previously described in Example 1).

As shown in Table 3, all the Samples 3-7 have shown a sorption rate that is below $1*10^{-3}$ mg cm$^{-2}$ min$^{-1}$. When the reversible sorber amount with respect to the total amount of the sorber powders (i.e. the total weight of reversible and irreversible sorbers) is more than 2% but less than 7%, a low sorption rate is obtained.

EXAMPLE 3

Rheological behavior of siloxane formulations has been analyzed by using a Rheometer RS600, with plate/cone geometry in rotational mode. A combined thermal bath and Peltier unit was adopted to control the temperature at 25° C. with 0.1° C. precision. The viscosity was evaluated as a function of the shear rate in the range 0.1-400 sec$^{-1}$.

FIG. 1 shows experimental viscosity values for different compositions containing 50% wt of Calcium Oxide but different zeolite loadings and particle size.

The use of different amount of nanozeolites in Sample 6 and Sample 7 (previously described in Table 3) changes the rheological behavior of the siloxane material with respect to the case when only Calcium Oxide is present (comparative 4 with CaO amount: 50% wt) and therefore allows the possibility to tune such parameter in function of the manufacturing needs.

Differently, the addition of 1 w/w % of zeolites powders of Na-LTA (4A) centered around 10 micron to the siloxane matrix containing 50 w/w % of Calcium Oxide (sample 6 micro) has no effect on the rheological properties of the composition.

The invention claimed is:

1. A composite barrier against ingress of $H_2O$ in sensitive devices, the barrier comprising: a polysiloxane matrix containing at least two types of sorbers, said polysiloxane matrix containing
   between 10% and 55% wt of an irreversible $H_2O$ sorber consisting essentially of powders of one or more alkaline earth metal oxides chosen from oxides of calcium, strontium, barium, magnesium, and
   between 1% and 5% wt of a $H_2O$ reversible sorber consisting essentially of powders of one or more aluminosilicates,
   wherein the size of at least 95% of the powders of said sorbers is not higher than 10 μm.

2. The composite barrier according to claim 1, wherein the weight ratio between the irreversible sorber and the reversible sorber is comprised between 2.7 and 45.

3. The composite barrier according to claim 2, wherein the weight ratio between the irreversible sorber and the reversible sorber is comprised between 13 and 20.

4. The composite barrier according to claim 1, wherein the weight amount of the reversible sorber with respect to the total weight amount of the powders of sorbers is more than 2% but less than 20%.

5. The composite barrier according to claim 1, wherein the weight amount of the reversible sorber with respect to the total weight amount of the powders of sorbers is comprised between 2.5% and 7%.

6. The composite barrier according to claim 1, wherein the size of the powders of the reversible sorber is comprised between 50 and 500 nm.

7. The composite barrier according to claim 1, wherein said irreversible sorber does not release $H_2O$ at a temperature equal or less than 180° C.

8. The composite barrier according to claim 1, wherein said reversible sorber releases $H_2O$ at temperatures comprised between 70 and 180° C.

9. A mixture for production of a composite barrier according to claim 1, containing mixtures comprising:
  a) between 40% and 70% wt of di-dimethyl siloxane with dimethylvinyl terminations,
  b) between 5% and 30% wt of di-methylvinyl or tri-methylvinyl silica, and containing between 10% and 55% wt of an irreversible moisture sorber consisting essentially of powders or one or more alkaline earth metal oxides chosen from oxides of calcium, strontium, barium, magnesium, and between 1% and 5% wt of a $H_2O$ reversible sorber consisting essentially of powders of one or more aluminosilicates, in which the size of at least 95% of the irreversible and reversible sorber powders is not higher than 10 μm.

10. The mixture according to claim 9 further containing di-dimethyl hydroxy siloxane up to 40% wt.

11. A device sensitive to presence of $H_2O$, the device comprising the composite barrier according to claim 1.

12. The device according to claim 11, wherein said composite barrier is disposed on the perimeter of said device.

13. The device according to claim 11, wherein said composite barrier fills the internal volume of said device.

14. The device according to claim 11, wherein said device is an electroluminescent organic device.

15. The device according to claim 11, wherein said device is an electronic or electric device.

16. The device according to claim 11, wherein said device is a micro-mechanical or micro-optolectronic device.

* * * * *